United States Patent
Basker et al.

(10) Patent No.: US 9,601,621 B1
(45) Date of Patent: Mar. 21, 2017

(54) SEMICONDUCTOR DEVICE INCLUDING DUAL SPACER AND UNIFORM EPITAXIAL BUFFER INTERFACE OF EMBEDDED SIGE SOURCE/DRAIN

(71) Applicant: International Business Machines Corporation, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/834,481

(22) Filed: Aug. 25, 2015

(51) Int. Cl.
| | |
|---|---|
| *H01L 29/417* | (2006.01) |
| *H01L 29/78* | (2006.01) |
| *H01L 29/66* | (2006.01) |
| *H01L 21/306* | (2006.01) |
| *H01L 29/165* | (2006.01) |
| *H01L 29/167* | (2006.01) |
| *H01L 21/02* | (2006.01) |
| *H01L 29/08* | (2006.01) |

(52) U.S. Cl.
CPC .... *H01L 29/7848* (2013.01); *H01L 21/02381* (2013.01); *H01L 21/02532* (2013.01); *H01L 21/30604* (2013.01); *H01L 29/0847* (2013.01); *H01L 29/165* (2013.01); *H01L 29/167* (2013.01); *H01L 29/41783* (2013.01); *H01L 29/41791* (2013.01); *H01L 29/66636* (2013.01); *H01L 29/66795* (2013.01); *H01L 29/7851* (2013.01)

(58) Field of Classification Search
CPC .............................................. H01L 2029/7858
See application file for complete search history.

(56) References Cited

U.S. PATENT DOCUMENTS

| | | |
|---|---|---|
| 5,714,413 A | 2/1998 | Brigham et al. |
| 6,245,620 B1 | 6/2001 | Jang et al. |
| 6,306,702 B1 | 10/2001 | Hao et al. |
| 6,995,065 B2 | 2/2006 | Chou et al. |

(Continued)

OTHER PUBLICATIONS

Basker et al., "Semiconductor Device Including Dual Spacer and Uniform Epitaxial Buffer Interface of Embedded SiGe Source/Drain", U.S. Appl. No. 14/951,660, filed Nov. 25, 2015.

(Continued)

*Primary Examiner* — Stephen W Smoot
(74) *Attorney, Agent, or Firm* — Cantor Colburn LLP; Vazken Alexanian

(57) ABSTRACT

A semiconductor device includes at least one semiconductor fin on an upper surface of a semiconductor substrate. The semiconductor fin includes a channel region formed of a first semiconductor material interposed between opposing embedded source/drain regions formed of a second semiconductor material different from the first semiconductor material. At least one gate stack is formed on the upper surface of the semiconductor substrate and wraps around the channel region. The embedded source/drain regions have a symmetrical shape and a uniform embedded interface.

3 Claims, 16 Drawing Sheets

(56) References Cited

U.S. PATENT DOCUMENTS

| | | | |
|---|---|---|---|
| 7,365,378 B2 | 4/2008 | Huang et al. | |
| 7,704,835 B2 | 4/2010 | Singh et al. | |
| 8,362,561 B2 | 1/2013 | Nuttinck et al. | |
| 8,383,503 B2 | 2/2013 | Johnson | |
| 2013/0140637 A1* | 6/2013 | Chang | H01L 29/7848 257/347 |
| 2014/0027783 A1* | 1/2014 | Yin | H01L 21/823431 257/77 |
| 2016/0079124 A1* | 3/2016 | Yin | H01L 21/823437 438/283 |

OTHER PUBLICATIONS

List of IBM Patents or Patent Applications Treated as Related; (Appendix P), Filed Feb. 3, 2016; 2 pages.

Tripathi et al., "Performance improvement of FinFET using spacer high K dielectric," J. Electron Devices, vol. 17, 2013, pp. 1447-1451.

Vega et al., "Three-dimensional FinFET source/drain and contact design optimization study," IEEE Transactions on Electron Devices, vol. 56, No. 7, 2009, pp. 1483-1492.

* cited by examiner

SEMICONDUCTOR DEVICE INCLUDING DUAL SPACER AND UNIFORM EPITAXIAL BUFFER INTERFACE OF EMBEDDED SIGE SOURCE/DRAIN

BACKGROUND

The present invention relates to semiconductor devices, and more specifically, to three-dimensional (3D) transistor devices.

Recent semiconductor fabrication methods have been developed to replace all or a portion of pure silicon (Si) fins with silicon germanium (SiGe) material, especially in p-type finFET devices. SiGe material reduces the threshold voltage (Vt) of a p-type semiconductor device, thereby increasing the drive current that flows through the channel. Further, SiGe material provides higher carrier mobility than fins consisting of only Si. Accordingly, SiGe fins typically have improved hole mobility performance compared to Si fins. The benefits of SiGe material described above have led to design trends that form fins with embedded SiGe (eSiGe) source/drain regions.

Referring to FIGS. 1-2, a conventional method of forming a finFET device 100 including eSiGe source/drain regions is illustrated. Conventional methods typically utilize only a single spacer layer followed by a directional etch to expose the underlying Si source/drain regions 102 of the fin while forming a single pair of spacers 104 on opposing sidewalls of the gate structure 106 (see FIG. 1). The exposed Si source/drain regions 102 are utilized as seed regions capable of epitaxially growing a semiconductor material therefrom.

Conventional eSiGe source/drain regions 108 typically include an epitaxially grown SiGe buffer layer 110 interposed between the original Si source/drain regions 102 and a subsequently grown highly-doped main SiGe layer 112 as further shown in FIG. 2. When performing a thermal anneal process to activate dopants of the main SiGe layer 112, for example, the buffer layer 110 serves to inhibit dopants of the highly-doped main SiGe layer 112 from diffusing into the fin channel region to prevent source/drain-channel shorting.

However, due to the natural asymmetrical directional growth of SiGe from Si, the SiGe buffer layer 110 is formed having an asymmetrical shape as further illustrated in FIG. 2. For example, the side portions 114a of the SiGe buffer layer 110 (i.e., grown from the Si sidewalls of the fin 102) are thinner than the base portions 114b (i.e., grown on the lower portion of Si source/drain regions of the fin 102). This asymmetrical shape (i.e., thickness delta) causes a non-uniform extension junction profile from the top of the fin channel to the bottom of the fin channel which can potentially affect the overall performance of the finFET device. For instance, the side portions 114a of the buffer layer 110 have a first total height ($H_1$) while the highly-doped main SiGe layer 112 has a second total height ($H_2$) that is less than $H_1$. Consequently, a non-uniform eSiGe junction is formed, particularly at the corner region 116 of the buffer layer 110.

SUMMARY

According to a non-limiting embodiment of the present invention, a semiconductor device includes at least one semiconductor fin on an upper surface of a semiconductor substrate. The semiconductor fin includes a channel region formed of a first semiconductor material interposed between opposing embedded source/drain regions formed of a second semiconductor material different from the first semiconductor material. At least one gate stack is formed on the upper surface of the semiconductor substrate and wraps around the channel region. The embedded source/drain regions have a symmetrical shape, and a uniform embedded interface.

According to another non-limiting embodiment, a method of forming a finFET device having symmetrically-shaped embedded source/drain regions comprises recessing source/drain regions of at least one semiconductor fin with respect to channel region of the semiconductor fin. The method further includes epitaxially growing a first semiconductor material from the at least one semiconductor fin. The first semiconductor material includes a side portion grown from opposing sidewalls of the channel region and a base portion grown from recessed portions of the source/drain regions. The method further includes selectively removing the base portion while maintaining the side portion to define a first height of the side portion. The method further includes epitaxially growing a second semiconductor material from the side portion and from the recessed source/drain regions so as to form embedded source/drain regions having a second height. The second height substantially matches the first height so as to form the symmetrically-shaped embedded source/drain regions According to still another non-limiting embodiment, a method of fabricating a semiconductor device comprises forming at least one semiconductor fin on an upper surface of a semiconductor substrate. The at least one semiconductor fin includes a channel region interposed between opposing source/drain regions. The method further includes recessing a portion of the source/drain regions with respect to the channel region. The method further includes epitaxially growing a first semiconductor material from opposing sidewalls of the channel region and from the recessed source/drain regions. The method further includes selectively removing a base portion of the first semiconductor material formed on the recessed source/drain regions while maintaining a side portion of the of the first semiconductor material formed on respective sidewalls of the channel region. The method further includes epitaxially growing a second semiconductor material from the side portions and from the recessed source/drain regions so as to form embedded source/drain regions having a symmetrical shape.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

FIGS. 3A-9B are a series of diagrams illustrating a method of fabricating a semiconductor device including eSiGe source/drain regions according to a non-limiting embodiment, in which:

FIG. 3A is a perspective view of an intermediate semiconductor device including a semiconductor fin formed atop a substrate, and a gate structure wrapping around a channel region of the semiconductor fin;

FIG. 9B is a cross-sectional view of the semiconductor device illustrated in FIG. 9A showing the highly-doped raised source/drain region having an upper surface that is flush with an upper surface of the preserved side portion and has a second total height equal to the first height of the preserved side portion so as to define a uniform epitaxially grown source/drain region.

DETAILED DESCRIPTION

Various non-limiting embodiments of the invention provide a semiconductor device including a dual spacer that defines an epitaxial buffer interface of an embedded SiGe source/drain region. The dual spacer protects the buffer layer during a second directional etch process that selectively removes a portion of the buffer layer from the original Si source/drain region of the fin. In this manner, the buffer layer is formed on only the sidewall of the fin channel region, while the lower etched region of original Si source/drain region is re-exposed. Accordingly, the highly-doped main SiGe portion can be grown directly from the Si source/drain region and sidewalls of the buffer layer such that the base portion of the buffer layer is formed uniform with respect to the highly-doped main SiGe portion from top of the fin channel to the bottom of the fin channel.

Figure 1:
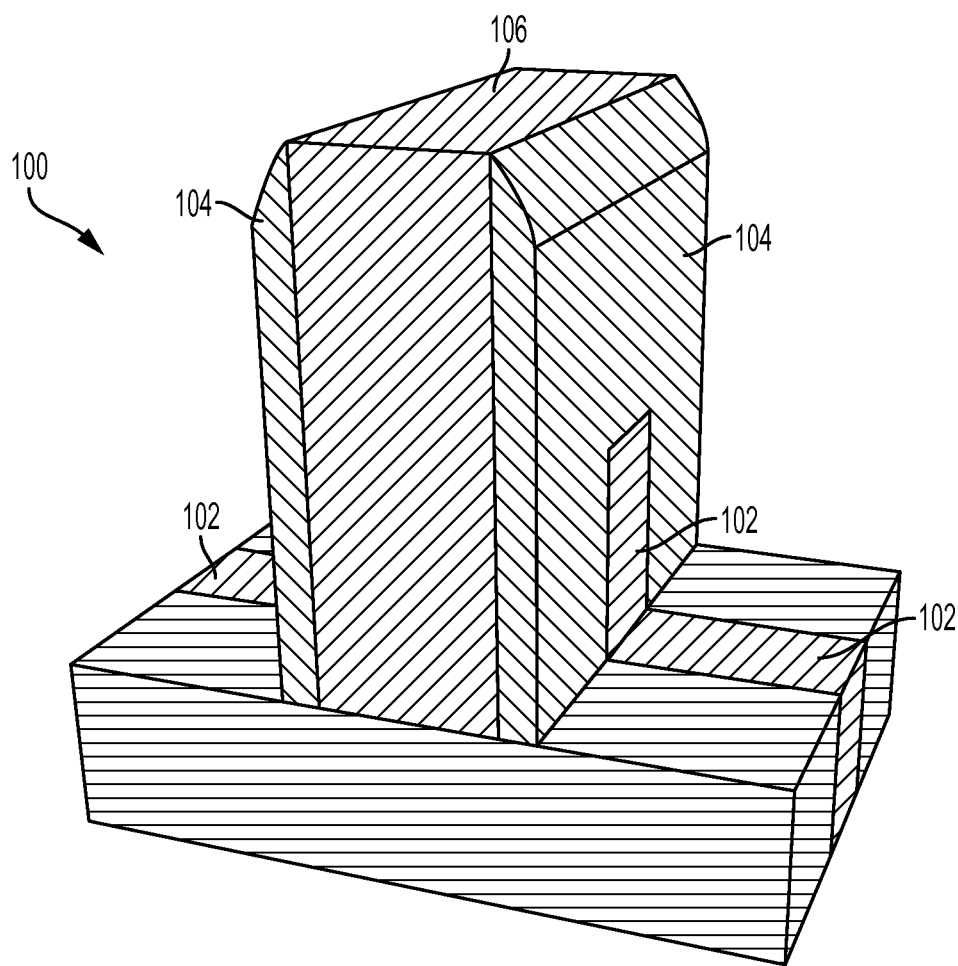
FIGS. 1-2 illustrate a conventional method of fabricating a finFET device including eSiGe source/drain regions.
Figure 2:
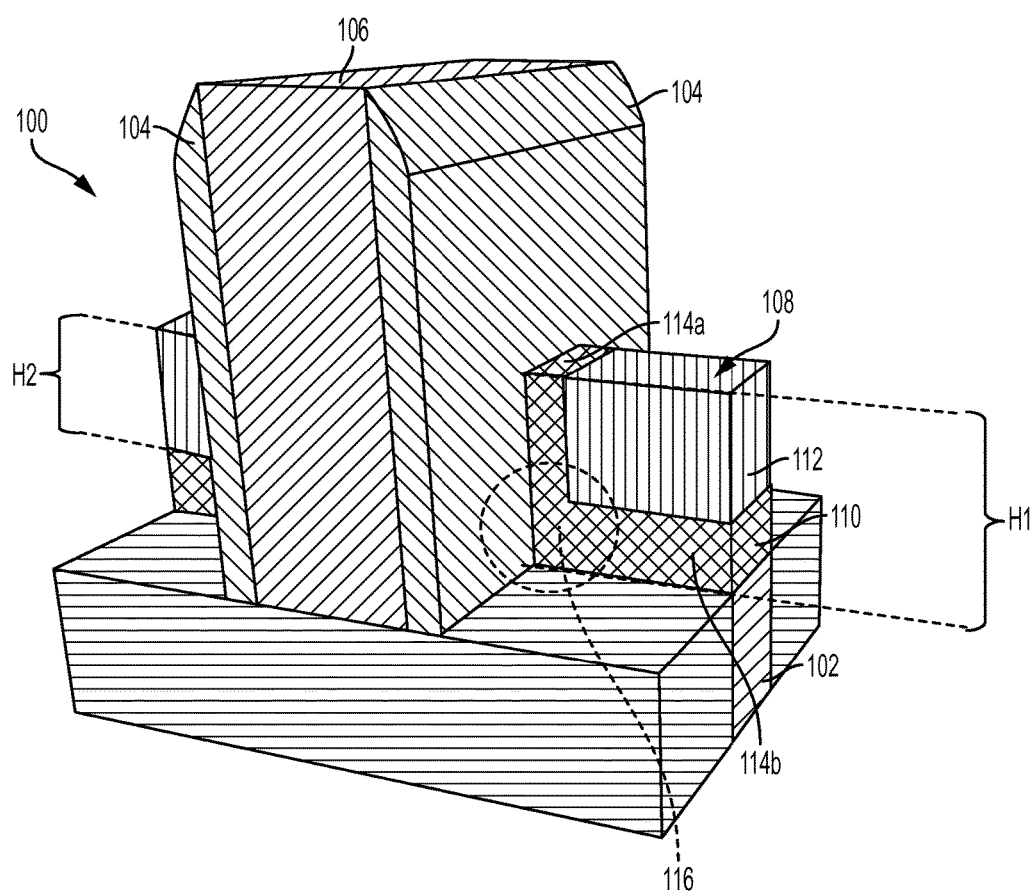
Figure 3A:
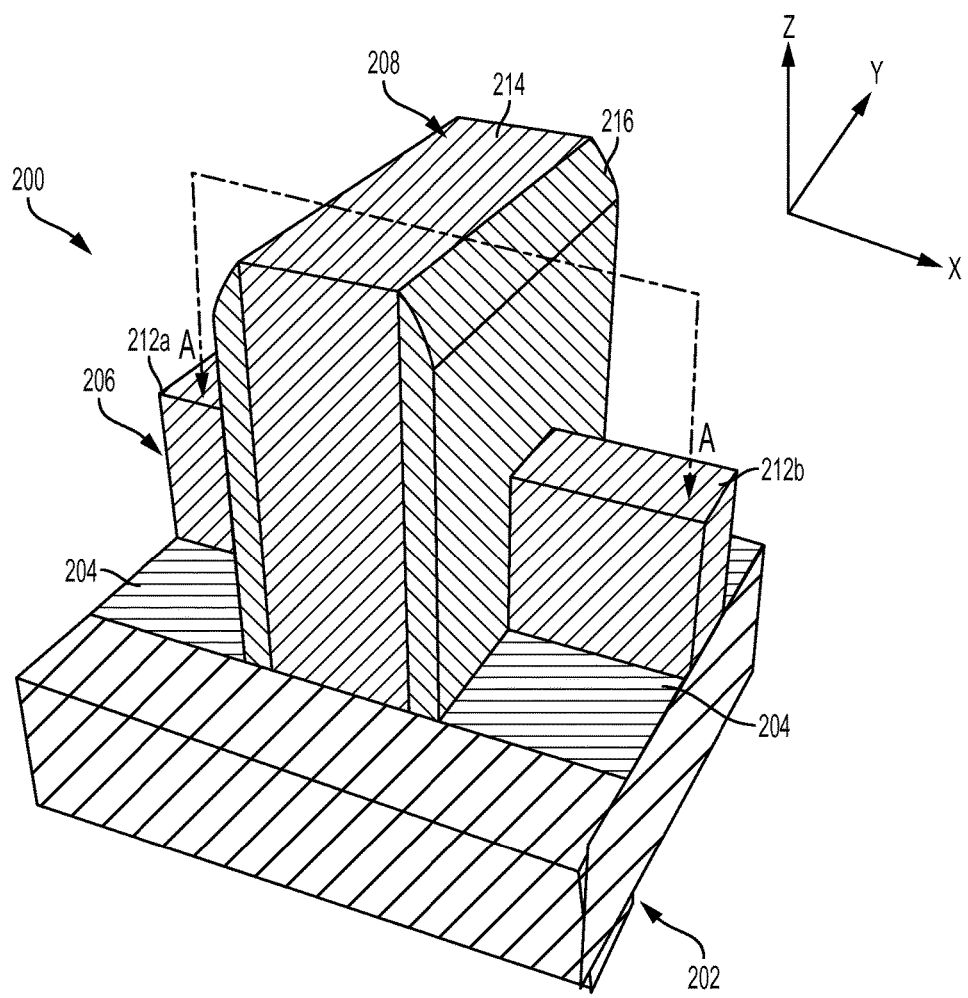
Figure 3B:
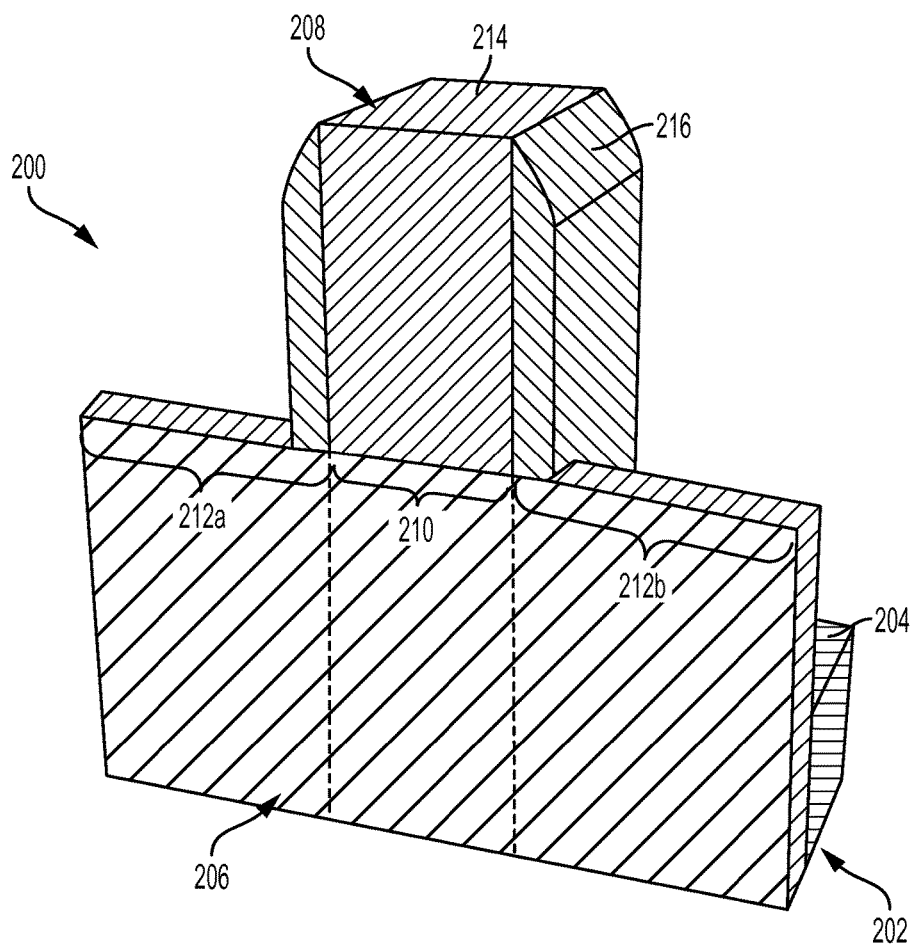
FIG. 3B is cross-sectional view of the intermediate semiconductor device taken along the line A-A showing initial source/drain regions of the fin abutting gate spacers formed on sidewalls of the gate structure.

With reference now to FIGS. 3A-3B, a semiconductor structure 200 which serves as a starting point for fabricating a finFET device in accordance with an exemplary embodiment is shown. In exemplary embodiments, the semiconductor structure 200 includes a semiconductor substrate 202 including one or more isolation regions 204 formed therein. The semiconductor substrate 202 extends along a first axis (e.g., an X-axis) to define a length, a second axis (e.g., a Y-axis) to define a width, and a third axis (e.g., a Z-axis) to define a height. According to a non-limiting embodiment, the substrate 202 is a bulk substrate formed from, for example, silicon (Si). The isolation region 204 is a shallow trench isolation (STI) region formed by depositing one or more dielectric materials such as silicon dioxide ($SiO_2$) in the bulk substrate 202 as understood by one of ordinary skill in the art. Although a bulk substrate 202 including an isolation region 204 is discussed going forward, it should be appreciated that the semiconductor substrate 202 may also be formed as a semiconductor-on-insulator (SOI) substrate without departing from the scope of the invention.

One or more semiconductor fins 206 are formed on an upper surface of the substrate 202. The fin 206 extends along the length (e.g., X-axis) of the substrate 202 to define a fin length. According to a non-limiting embodiment, the fin is formed semiconductor material such as, for example, Si.

Various patterning techniques may be used to form the semiconductor fin 206. For example, a suitable hardmask blocking layer (not shown) formed of silicon dioxide ($SiO_2$), for example, can be initially deposited on an upper surface of the bulk substrate 202. Next, a suitable hardmask cap layer (not shown) formed of silicon nitride (SiN), for example, is deposited atop the hardmask blocking layer. The hardmask cap layer and the hardmask blocking layer will be used to pattern the underlying bulk substrate 202 while serving to protect the fin 206 during the formation of the isolation region 204.

Next, the hardmask blocking layer and the hardmask cap layer are etched to define the desired fin pattern. A developed photoresist mask (not shown) is typically used to define the desired fin pattern. The hardmask blocking layer and hardmask cap layer can then be patterned selective to the developed photoresist mask according to a reactive ion etch (RIE) process. The patterned hardmask layers will then be used to transfer the desired fin pattern into the underlying bulk substrate layer 202 according to a RIE process to define one or more of the semiconductor fins 206. It should be appreciated that the length and width of the patterning can be determined according to the desired fin dimensions for the particular application.

The semiconductor structure 200 further includes one or more gate structures 208 formed atop the isolation region 206. The gate structure 208 extends along a width (e.g. Y-axis) of the substrate 202 so as to wrap around the sidewalls and upper surface of the fin 206. The arrangement of the gate structure 208 and the fin 206 defines a covered channel region 210 interposed between a pair of exposed fin regions 212a-212b which are reserved for the source/drain regions of the semiconductor device 200 (see FIG. 3B). Going forward, these reserved fin regions 212a-212b will be referred to as initial source/drain regions 212a-212b.

The gate structure 208 includes a gate stack 214 and gate spacers 216 formed on opposing sidewalls of the gate stack 214. The gate stack 214 is formed from various conductive gate materials understood by those of ordinary skill in the art, and has a length ranging from approximately X nm to approximately Y nm. The gate spacers 216 are formed from a low-k material such as, for example, silicon nitride (SiN), and have a thickness (e.g., along the X-axis) ranging from approximately 8 nm to approximately 10 nm. Although not illustrated, a gate dielectric layer (e.g., a high-k gate dielectric layer) and one or more work function metal layers. The gate dielectric layer may be interposed between the fin 206 and the gate stack 214. The work function metal layers include, but are not limited to, a titanium nitride (TiN) liner and a tantalum nitride (TaN) liner, which are formed on sidewalls of the gate stack 214 as understood by one of ordinary skill in the art. In this case, it should be appreciated that the gate structure 208 includes the gate stack 214, the gate dielectric layer, the work function metals, and the gate spacers 216.

Figure 4A:
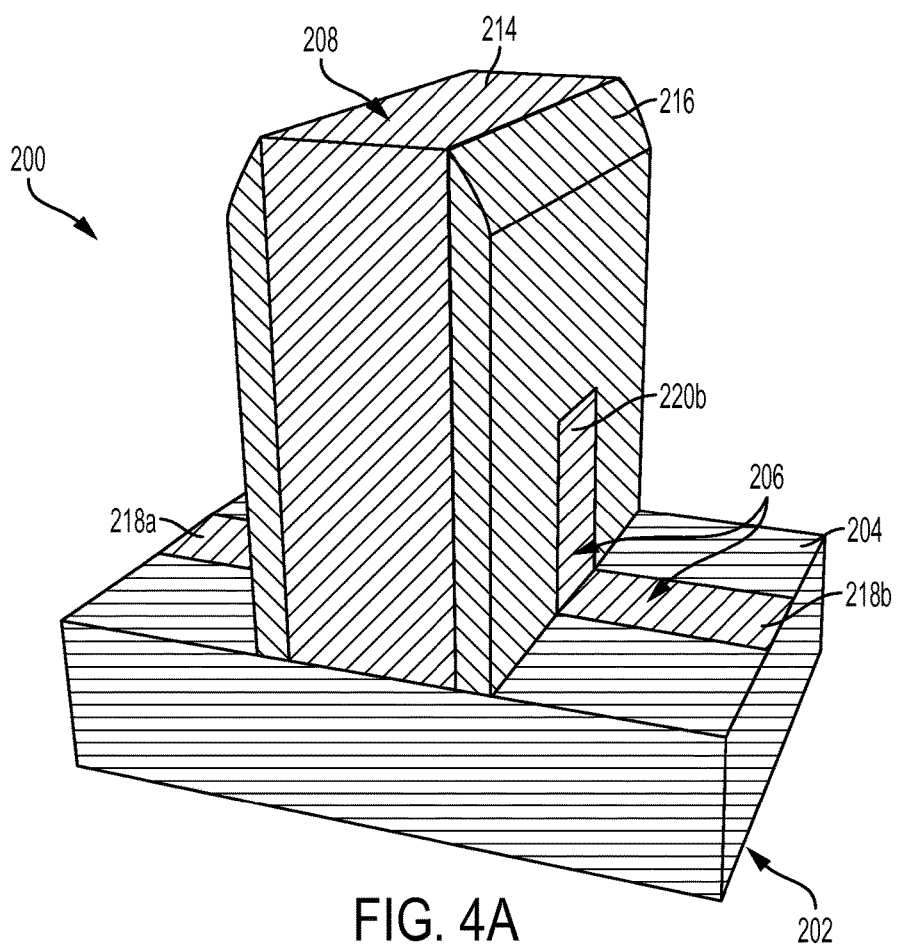
FIG. 4A is a perspective view of the semiconductor device illustrated in FIGS. 3A-3B following a first directional etch process that stops on the upper surface of the substrate so as to recesses the initial source/drain regions.
Figure 4B:
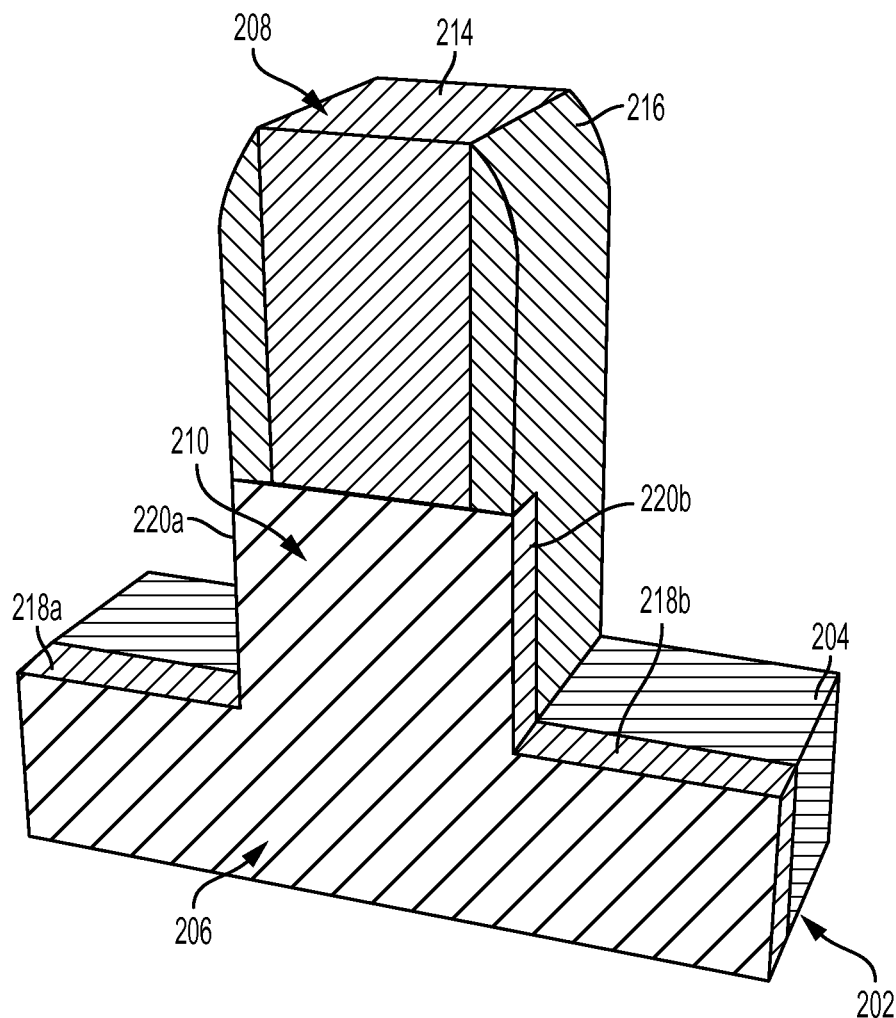
FIG. 4B is a cross-sectional view of the semiconductor device illustrated in FIG. 4A showing the recessed source/drain regions being flush with the upper surface of the substrate.

Referring to FIGS. 4A-4B, the semiconductor device 200 is illustrated following a first anisotropic directional etching process. A reactive ion etch (RIE), for example, that is selective to the material of the gate spacers 216 (e.g., SiN) and the material of the isolation region 204 (e.g., $SiO_2$) may be performed so as to etch the reserved fin regions 212a-212b (i.e., the uncovered portions of the fin 206) while stopping on the isolation region 204. Moreover, the gate structure 208 serves as a mask to protect the channel region 210 when recessing the source/drain regions 212a-212b. In this manner, remaining fin base portions 218a-218b are formed flush with the upper surface of the isolation region 204, while remaining fin side portions 220a-220b are formed flush with sidewalls of the gate spacers 216.

Figure 5A:
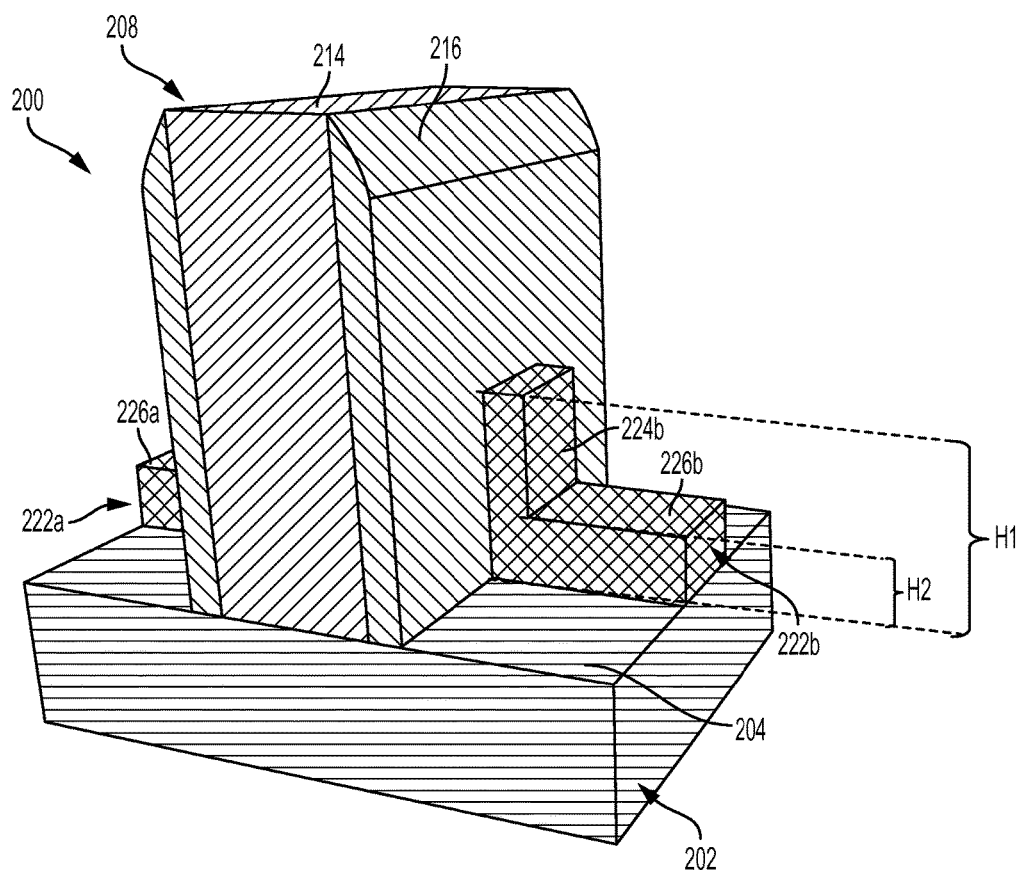
FIG. 5A is a perspective view of the semiconductor device illustrated in FIGS. 4A-4B after epitaxially growing a semiconductor buffer layer from exposed portions of the recessed source/drain regions and sidewalls of the fin.
Figure 5B:
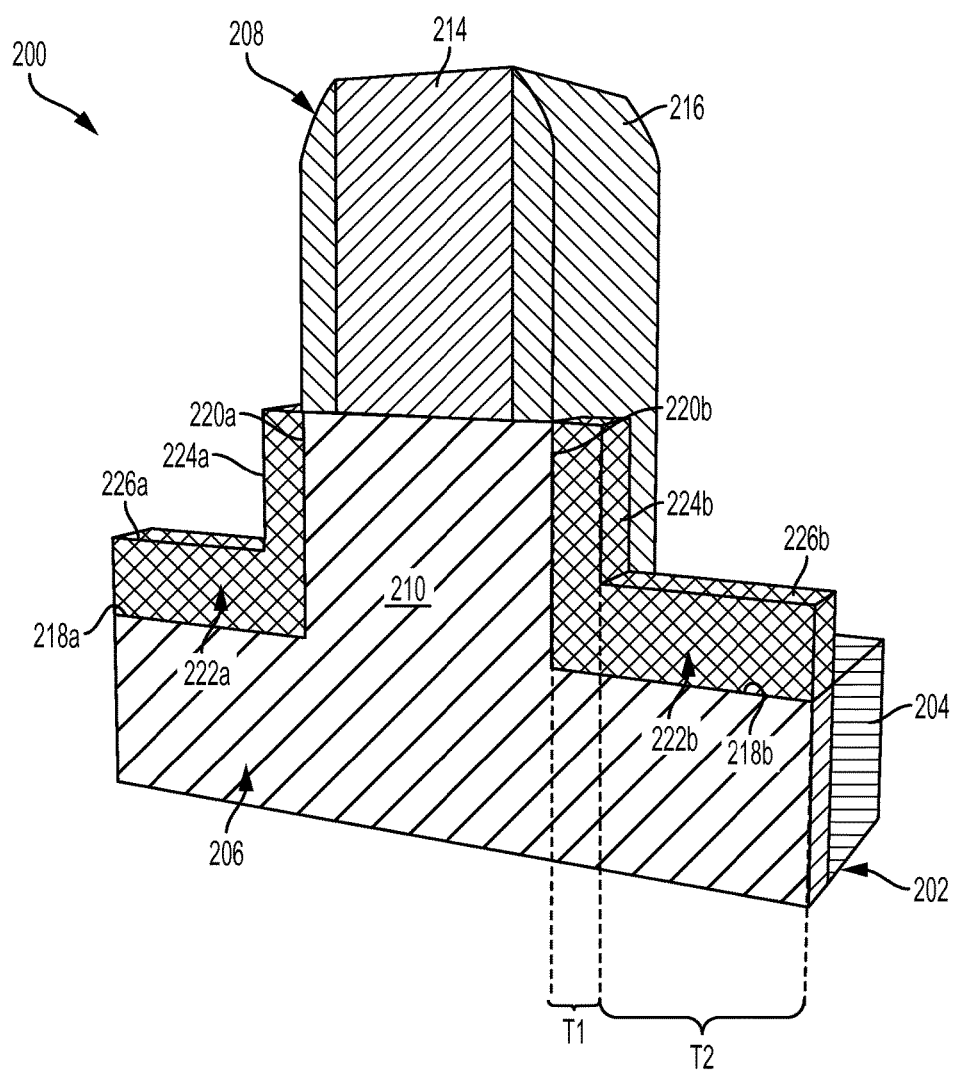
FIG. 5B is a cross-sectional view of the semiconductor device illustrated in FIG. 5A showing the buffer layer having a thin side portion formed against the sidewall of the fin and extending from the recessed source/drain region to a bottom portion of the gate spacers, and a thick base portion formed on the recessed source/drain regions.

Referring to FIGS. 5A-5B, buffer layers 222a-22b are formed on exposed portions of the fin 206. For instance, various well-known epitaxy processes may be used to grow a semiconductor material from the base portions 218a-218b and the fin side portions 220a-220b, respectively. The epitaxial grown semiconductor material includes, for example, undoped silicon germanium (SiGe) or SiGe having a low concentration of dopants including, but not limited to, boron (B). The dopant concentration of the buffer layers 222a-222b may range from approximately $0/cm^3$ (i.e., un-doped) to approximately $10^{19}/cm^3$. In this manner, the buffer layers 222a-222b may serve to inhibit diffusion of dopants into the channel region when exposing the semiconductor device 200 to various thermal anneal processes understood by one of ordinary skill in the art. Although a p-FET device is described going forward, it should be appreciated that an n-FET device may be formed in a similar manner as described above. When forming an n-FET device, the epitaxial grown semiconductor material is undoped Si, or Si having a low concentration of dopants including, but not limited to, phosphorous (P).

The buffer layers 222a-222b each include a side portion 224a-224b and a base portion 226a-226b as further illustrated in FIG. 5B. The side portions 224a-224b extend from the recessed surface of the reserved source/drain regions 218a-218b to an upper surface of the preserved fin 204 (i.e., the portion of the fin 206 defining an interface between the gate structure 208 and the fin 204) to thereby defining a first total height ($H_1$) equal or approximately equal to the fin 206 and a first total thickness ($T_1$) ranging from approximately 3 nm to approximately 5 nm. During the epitaxy process, however, crystal growth of the buffer layers 222a-222b naturally grows slower in the lateral direction (e.g., along the X-axis) compared to the vertical direction (e.g., along the Z-axis). Therefore, the base portions 226a-226b extend from the recessed surface at a second total height ($H_2$) ranging from approximately 8 nm to approximately 10 nm. A second total thickness ($T_2$) depends on the lateral dimension of source/drain. Accordingly, $T_2$ may range from approximately 20 nm to approximately 40 nm.

Figure 6A:
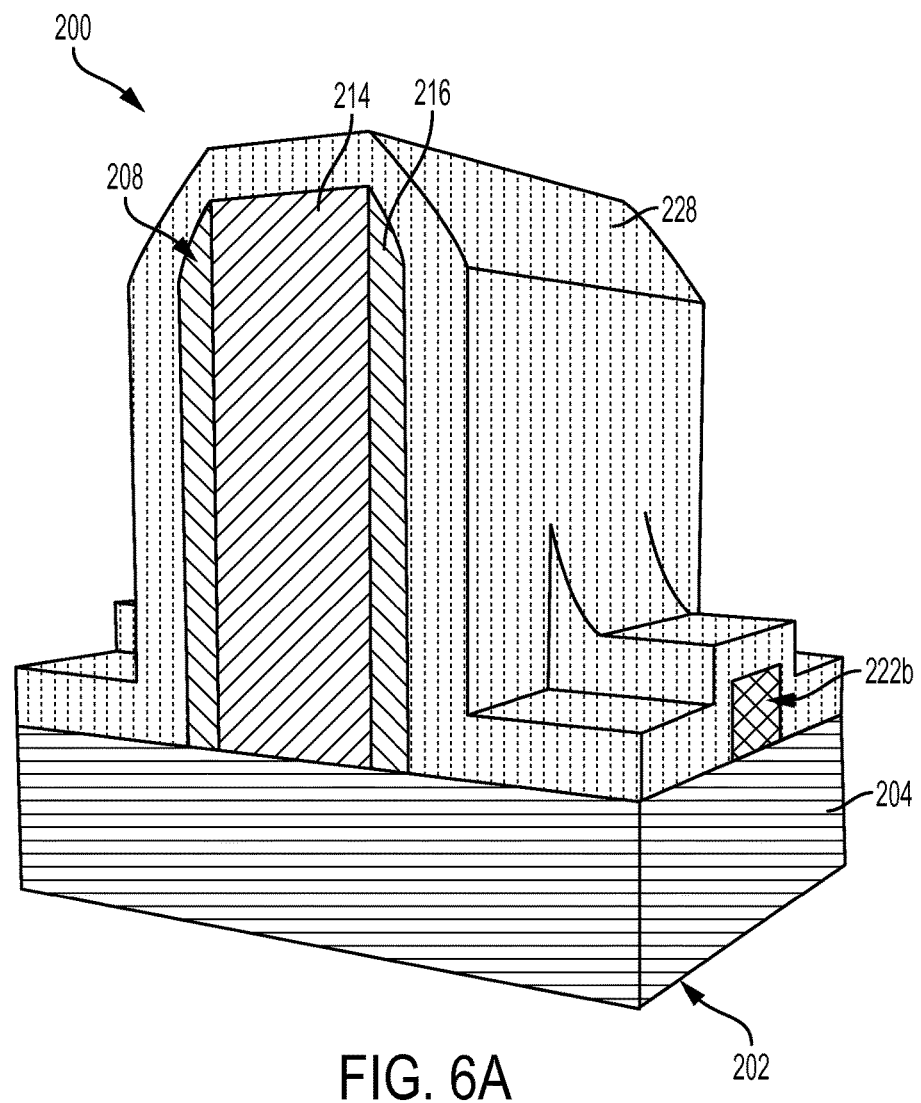
FIG. 6A is a perspective view of the semiconductor device illustrated in FIGS. 5A-5B after depositing an outer conformal spacer layer on an upper surface of the substrate so as to cover the buffer layer, the gate spacers and the upper surface of the gate structure.
Figure 6B:
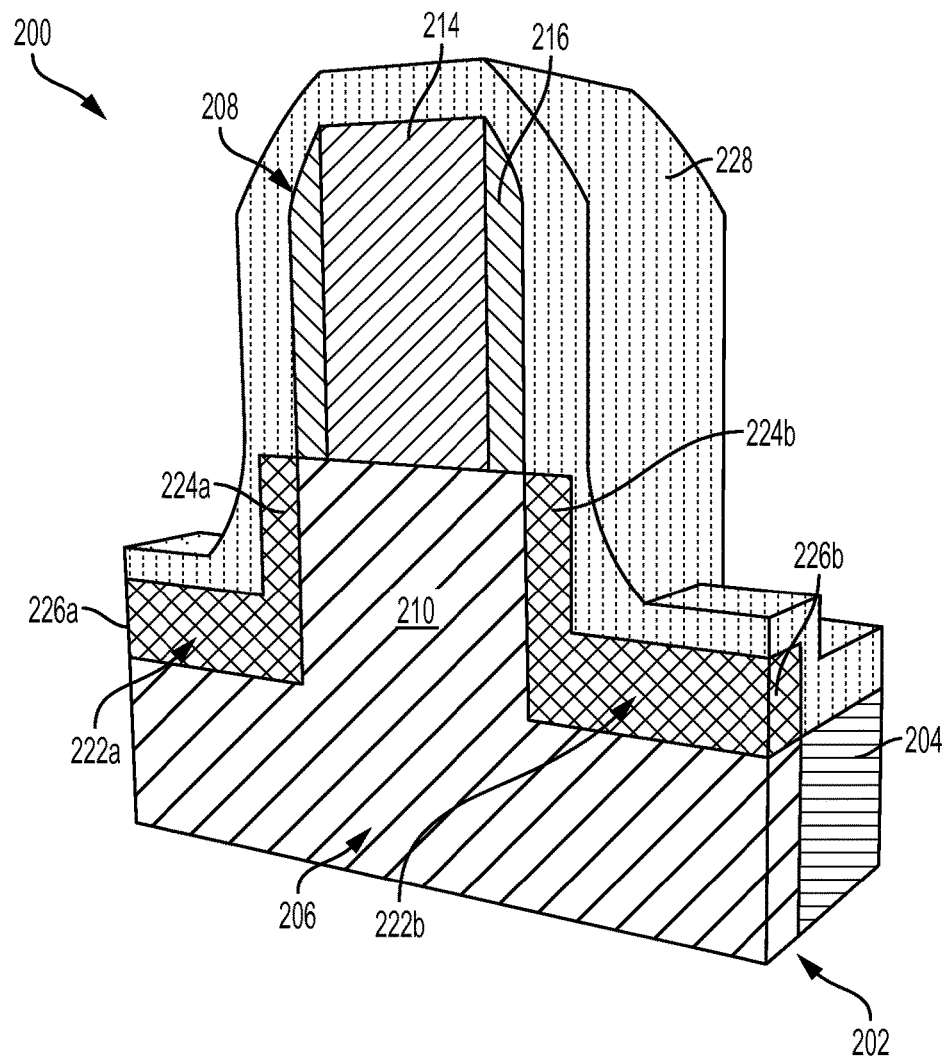
FIG. 6B is a cross-sectional view of the semiconductor device illustrated in FIG. 6A showing the outer spacer layer conforming to an upper surface of the buffer layer such that the buffer layer is interposed between the outer spacer layer and the fin.

Referring to FIGS. 6A-6B, a conformal outer spacer layer 228 is deposited on the upper surface of the substrate 202 so as to cover the buffer layers 222a-222b, the sidewalls of the gate spacers 216 and an upper surface of the gate stack 214. Various disposition processes may be used to deposit the outer spacer layer 229 such as, for example, chemical vapor deposition (CVD). The outer spacer layer 228 has a thickness ranging for example, from approximately 4 nm to approximately 8 nm, and is formed from various nitride-based materials including, but not limited to, silicon nitride (SiN).

Figure 7A:
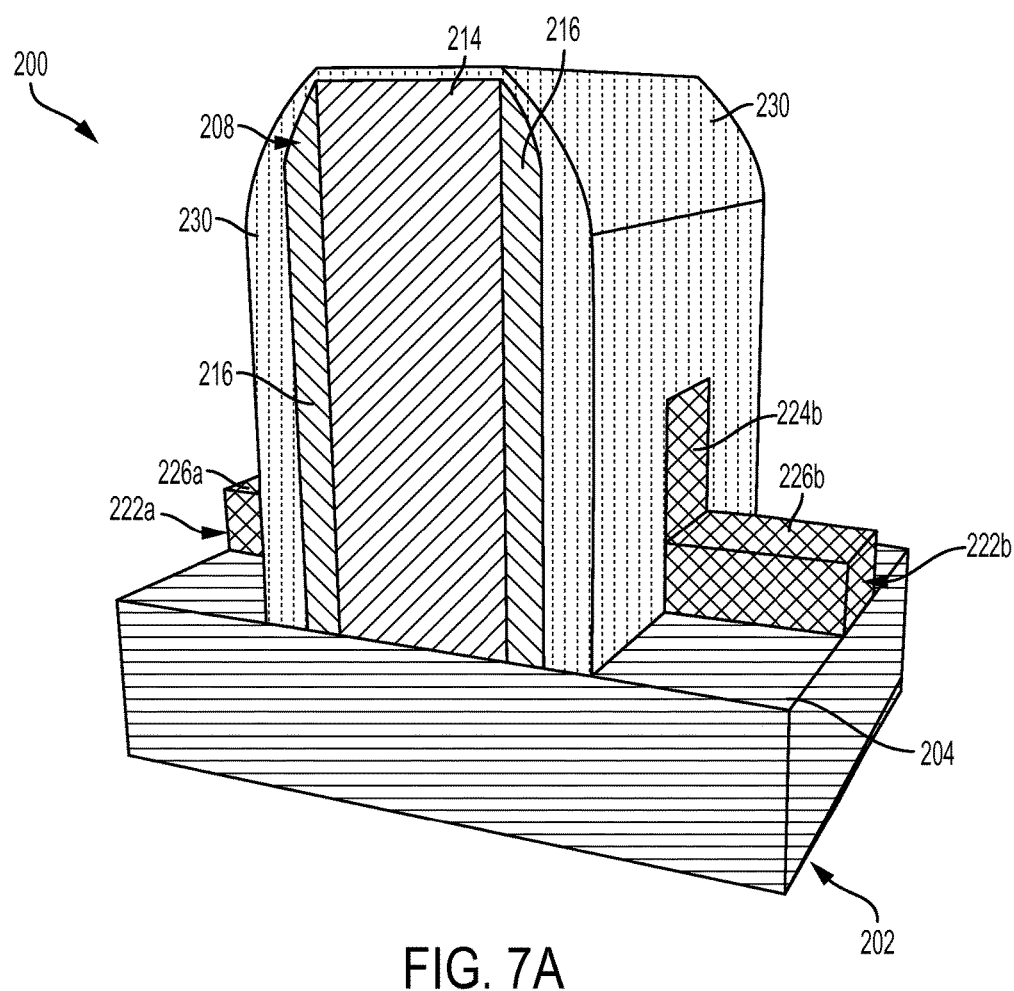
FIG. 7A is a perspective view of the semiconductor device illustrated in FIGS. 6A-6B following a second directional etch process selective to the buffer layer so as to form outer spacers on the sidewalls of the gate spacers.
Figure 7B:
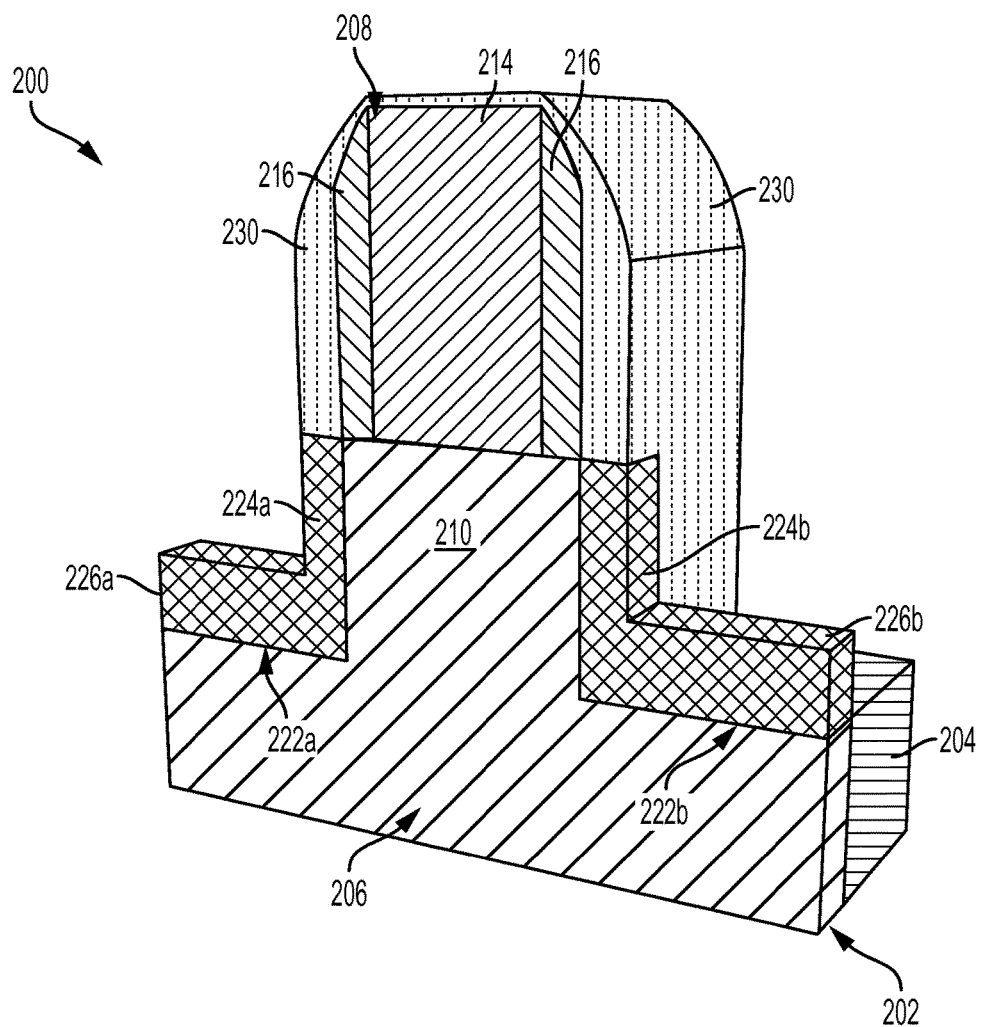
FIG. 7B is a cross-sectional view of the semiconductor device illustrated in FIG. 7A showing the side portion of the buffer layer covered by the outer spacer while the base portion of the buffer layer is exposed.

Turning to FIGS. 7A-7B, the semiconductor device 200 is illustrated following a second selective directional etch process that etches the outer spacer layer 220 to form outer spacers 230 on the sidewalls of the gate spacers 216. According to a non-limiting embodiment, the second directional etch process includes a dry RIE process that is selective to the material of the buffer layers 222a-222b and the isolation region 204. Further, the portion of the outer spacer material covering the base portions 226a-226b is etched at a faster rate than the portion of the outer spacer layer 229 covering the side portions 224a-224b. Accordingly, the side portions 224a-224b are preserved and remain covered by respective outer spacers 230 while the base portions 226a-226b are exposed.

Figure 8A:
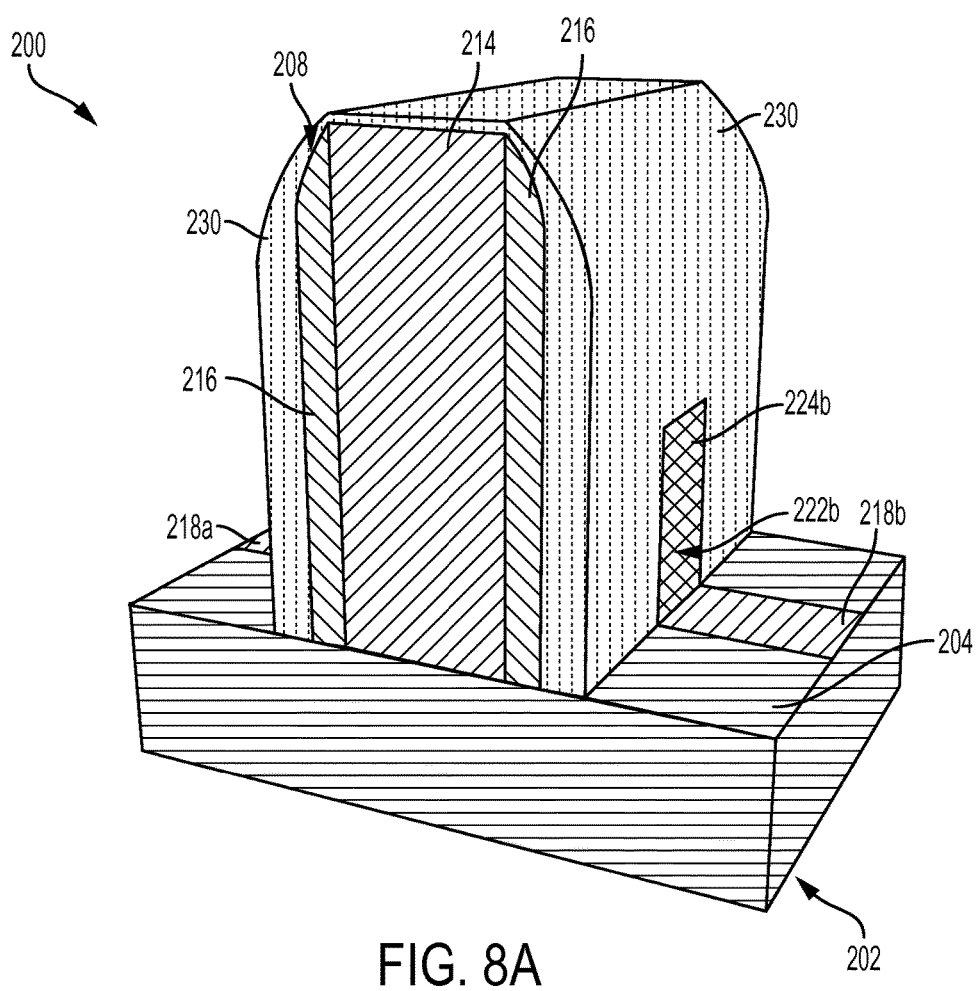
FIG. 8A is a perspective view of the semiconductor device illustrated in FIGS. 7A-7B following a third directional etch process selective to the substrate and the fin such that the base portion of the buffer layer is removed while the side portion of the buffer layer located beneath the outer spacers is preserved.
Figure 8B:
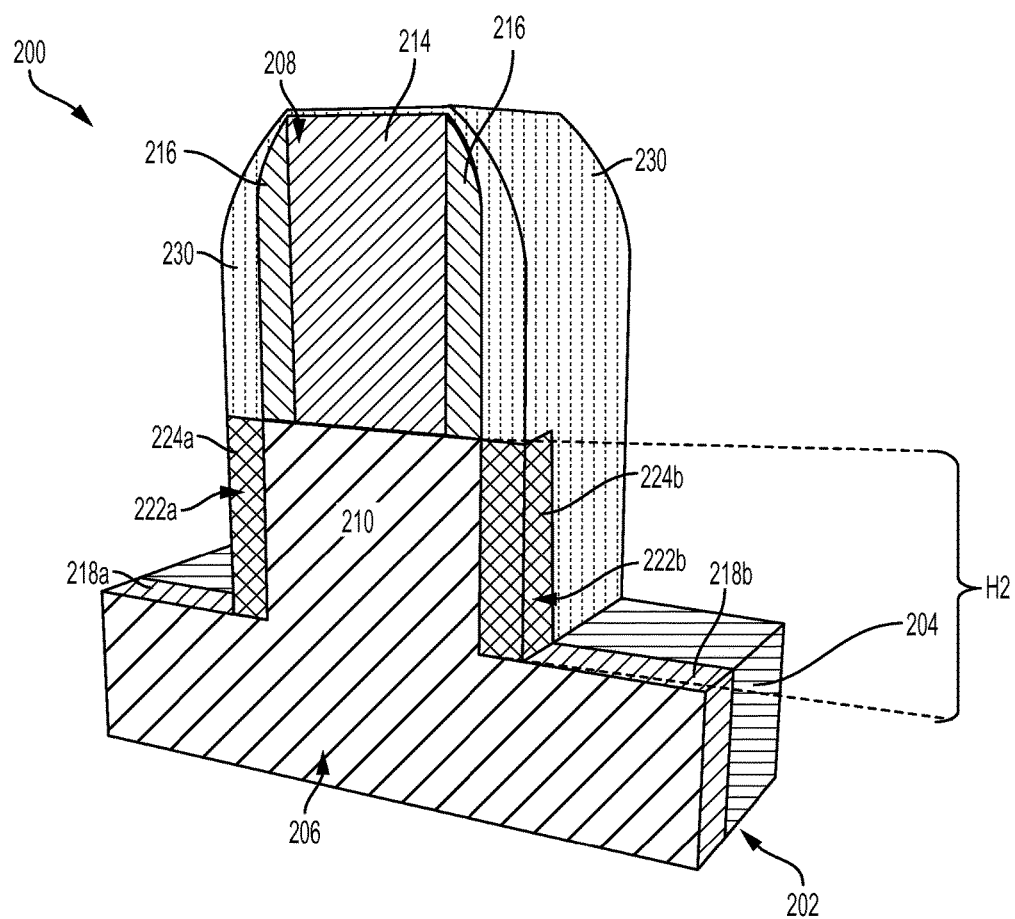
FIG. 8B is a cross-sectional view of the semiconductor device illustrated in FIG. 8A showing the preserved side portion extended from the outer spacer to the recessed source drain region of the fin to define a first total height.

Referring to FIGS. 8A-8B, the semiconductor device is illustrated following a third selective directional etch process that removes the base portion 226a-226b of the buffer layers 222a-222b from the upper surface of the recessed source/drain regions 218a-218b. The third etch process includes, for example, a dry anisotropic RIE process selective to the material of the isolation region 204, the fin 206 and the outer spacers 230 can be performed such that the base portions 226a-226b are removed while the side portions 224a-224b located beneath respective outer spacers 230 are preserved. In this manner, the side portions 224a-224b are formed flush with the respective outer spacers 230, while the recessed source/drain regions 218a-218b are re-exposed.

Figure 9A:
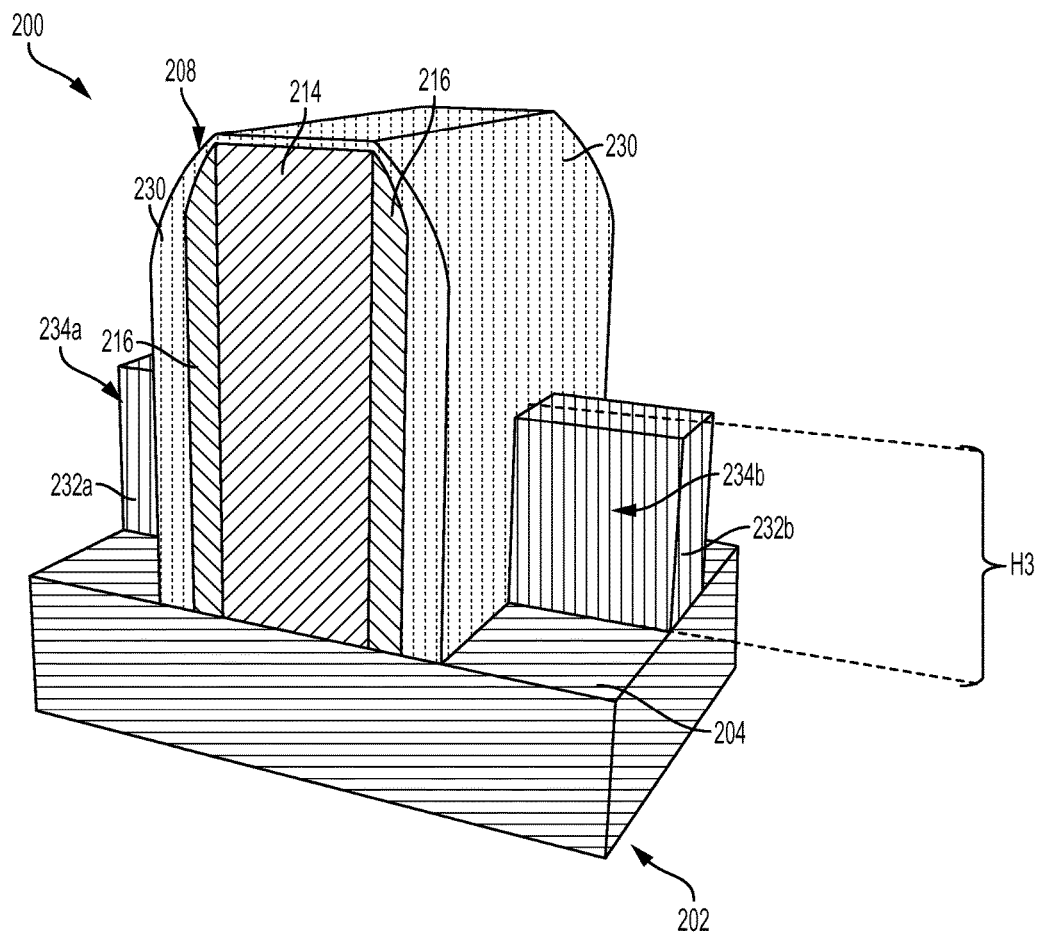
FIG. 9A is a perspective view of the semiconductor device illustrated in FIGS. 8A-8B after epitaxially growing a highly-doped raised source/drain region from the preserved side portion of the buffer layer and the recessed source/drain regions of the fin.
Figure 9B:
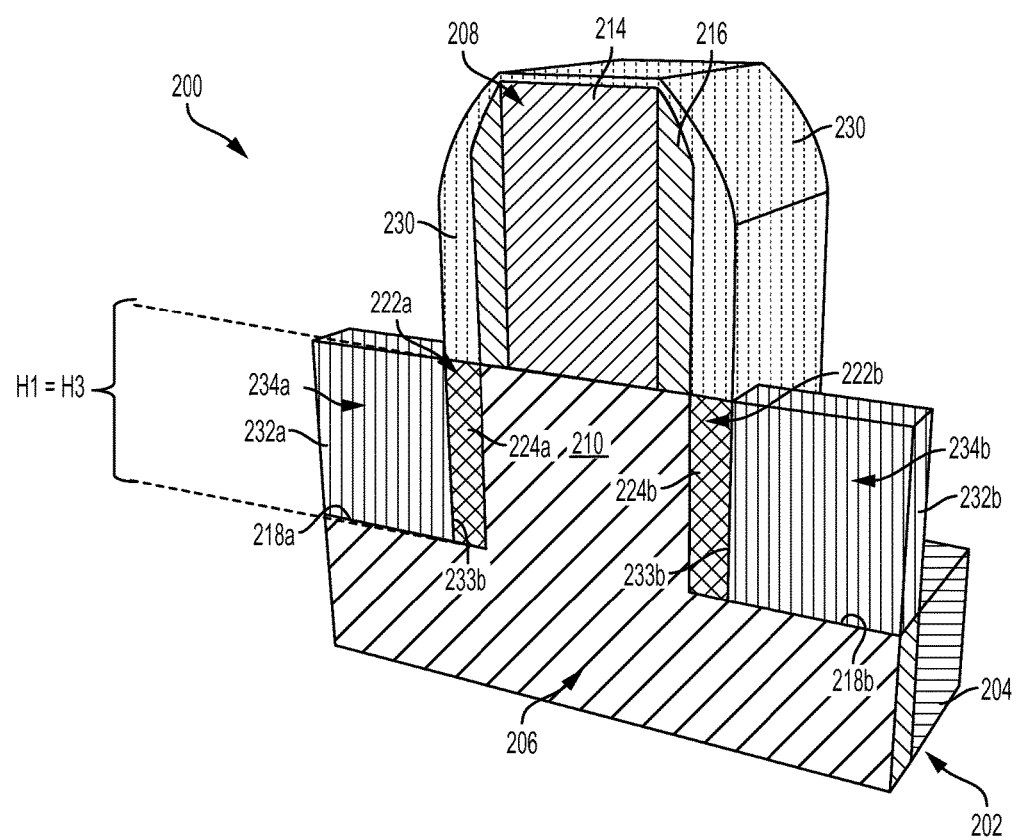

Turning now to FIGS. 9A-9B, the semiconductor device 200 is illustrated after epitaxially growing highly-doped raised source/drain layers 232a-232b from the recessed source/drain regions 218a-218b and the preserved buffer layer side portions 224a-224b, respectively. Accordingly, a lower portion of the raised source/drain layers 232a-232b may be formed directly against a surface of the initial fin 206 (i.e., the recessed source/drain regions 218a-218b), while sides of the raised source/drain layers 232a-232b are formed directly against the buffer layer 222a-222b (i.e., the side portions 224a-224b).

The combination of the remaining buffer layers 222a-222b (i.e., the preserved side portions 224a-224b) and the highly-doped raised source/drain layers 232a-232b can be viewed as embedded SiGe (eSiGe) source/drain layers 234a-234b. As further illustrated in FIG. 9B, the highly-doped raised source/drain layers 232a-232b have an upper surface that is flush with an upper surface of a respective preserved side portion 224a-224b. Accordingly, the highly-doped raised source/drain layers 232a-232b have a total height ($H_3$) equal or substantially equal to the first height of the preserved side portions 218a-218b ($H_1$) so as to define symmetrical eSiGe source/drain regions 234a-234b as further illustrated in FIG. 9B. Further, each buffer layer 222a-222b entirely contacts a respective raised source/drain layer 232a-232b so as to define an embedded interface 233a-233b therebetween. The embedded interface extends from the upper surface of substrate 202 (e.g., the surface of the recessed source/drain regions 218a-218b) to an upper surface of the channel region 210. Accordingly, embedded interface 233a-233b between the buffer layers 222a-222b (i.e., the preserved side portions 224a-224b) and the raised source/drain layers 232a-232b is uniform.

Various epitaxy processes may be used to grow the highly-doped raised source/drain layers 232a-232b from the base portions 218a-218b and the buffer layer side portions 224a-224b. The epitaxial grown semiconductor material includes, for example, in-situ doped silicon germanium (SiGe) having a high concentration of dopants including, but not limited to, boron (B). The dopant concertation of the raised source/drain layers 232a-232b may range from approximately $5 \times 10^{19}/cm^3$ to approximately $10^{21}/cm^3$. In this manner, uniform eSiGe source/drain regions 234a-234b are formed including buffer layers 222a-222b (i.e., the preserved buffer layer side portions 224a-224b) which serve to inhibit diffusion of dopants into the channel region when exposing the semiconductor device 200 to one or more well-known subsequent thermal anneal processes. Although a p-FET device is described going forward, it should be appreciated that an n-FET device may be formed in a similar manner as described above. When forming an n-FET device, the raised source/drain layers 232a-232b may include in-situ doped epitaxial grown Si, having a high concentration of dopants including, but not limited to, phosphorous (P).

As described in detail above, the base portions 226a-226b of each buffer layer 222a-222b is removed prior to forming the raised source/drain layers 232a-232b. In this manner, the uniformity of the eSiGe source/drain region 234a-234b is substantially improved compared to conventional finFET devices that utilize eSiGe source/drain regions. Accordingly, a finFET device having a uniform eSiGe source/drain region profile is provided, thereby improving the overall performance the semiconductor device 200.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
    at least one semiconductor fin on an upper surface of a semiconductor substrate, the at least one semiconductor fin including a channel region comprising a first semiconductor material interposed between opposing embedded source/drain regions comprising a second semiconductor material different from the first semiconductor material; and
    at least one gate stack on the upper surface of the semiconductor substrate and wrapping around the channel region; and
    a first pair of gate spacers on opposing sidewalls of the gate stack, and a second pair of outer spacers on opposing sidewalls of the gate spacers,
    wherein the embedded source/drain regions each include a buffer layer and a raised source/drain layer, the raised source/drain layer having a different doping concentration with respect to the buffer layer, and
    wherein an entire portion of the buffer layer is located beneath only the outer spacers, and wherein the embedded source/drain regions have a substantially symmetrical shape.

2. The semiconductor device of claim 1, wherein a first side of each buffer layer contacts a second side of a respective raised source/drain layer thereby defining a single respective embedded interface having a uniform shape.

3. The semiconductor device of claim 2, wherein a total height of each buffer layer is approximately equal to a total height of the raised source/drain region coupled at a respective embedded interface.

* * * * *